(12) United States Patent
Kadanka et al.

(10) Patent No.: US 6,373,295 B2
(45) Date of Patent: *Apr. 16, 2002

(54) RAIL-TO-RAIL DRIVER FOR USE IN A REGULATOR, AND METHOD

(75) Inventors: Petr Kadanka; Antonin Rozsypal, both of Roznov pod Radhostem (CS)

(73) Assignee: Semiconductor Components Industries LLC, Phoenix, AZ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,714

(22) Filed: Jun. 21, 1999

(51) Int. Cl.[7] .................................................. H03B 1/00
(52) U.S. Cl. ........................ 327/108; 327/112; 327/74; 327/478
(58) Field of Search .......................... 327/108, 72, 74, 327/75, 50, 51, 52, 53, 478, 55, 56, 58, 60, 62, 63, 71, 309, 318, 319, 432, 2

(56) References Cited

U.S. PATENT DOCUMENTS

| | | | | |
|---|---|---|---|---|
| 4,749,882 A | * | 6/1988 | Morgan ...................... 307/263 |
| 5,237,213 A | * | 8/1993 | Tanoi ......................... 307/290 |
| 5,440,258 A | * | 8/1995 | Galbi et al. ................. 327/112 |
| 5,550,501 A | * | 8/1996 | Ito et al. ..................... 327/374 |
| 5,587,677 A | * | 12/1996 | Samani ....................... 327/108 |
| 5,668,500 A | | 9/1997 | LeFevre ..................... 330/253 |
| 5,994,942 A | * | 11/1999 | Itoh ............................ 327/309 |

* cited by examiner

*Primary Examiner*—Kenneth B. Wells
*Assistant Examiner*—Hai L. Nguyen

(57) ABSTRACT

For use in a regulator, a driver (200) has a first transistor pair (203, 204) for alternatively pulling a drive line (OUT, 196) to magnitudes in a limited magnitude range between first and second reference lines (191, 192) depending on an input signal (IN, 195). Parallel to the first pair (203, 204), a second transistor pair (212, 210) alternatively pulls the drive line (OUT, 196) substantially to the reference lines (191, 192). The second pair (212, 210) is controlled by a comparator arrangement (120, 130) comparing the input signal to first (REF_1) and second (REF_2) reference signals and activating the second pair (212, 210) substantially only when the signal (OUT) on the drive line (196) driven by the first pair reaches a magnitude limit. The transistors (203, 204) of the first pair are arranged as emitter followers and the transistors (212, 210) of the second pair are arranged as switched current sources.

7 Claims, 3 Drawing Sheets

RAIL-TO-RAIL DRIVER FOR USE IN A REGULATOR, AND METHOD

FIELD OF THE INVENTION

The present invention generally relates to electronic circuits, and, more particularly, to a driver circuit used in a regulator, and to a method.

BACKGROUND OF THE INVENTION

Many electronic system (e.g., mobile phones) comprise regulators which couple supply devices (e.g., batteries, main transformers) and consuming devices (e.g., transmitters, speakers, logic circuits, memories). The regulator usually comprises a driver and a power transistor coupled between supply device and consuming device. The driver provides a control signal to a control electrode of the power transistor. The control signal should (i) be able to make the power transistor completely non-conductive if required and (ii) change in a sufficient short time interval.

As it will be explained later by an example (FIG. 2), drivers of the prior art provide only "weak" control signals. The present invention seeks to provide an improved driver, a regulator implementing the driver and a method which mitigate or avoid these and other disadvantages and limitations of the prior art.

DETAILED DESCRIPTION OF A PREFERRED EMBODIMENT

The term "transistor" is intended to include any device having at least two main electrodes (e.g., emitter and collector, or source and drain) and a control electrode (e.g., base or gate). The impedance between the main electrodes is controlled by a signal applied to the control electrode. For example, transistors can be bipolar transistors (e.g., PNP, NPN) or field effect transistors (FETs). The terms "first type" (e.g., for PNP or NPN transistors; P-FET or N-FET) and "second type" (e.g., for NPN or PNP transistors; N-FET or P-FET) are intended to distinguish complementary transistors of opposite conductivity. "First type" and "second type" can refer to either NPN or PNP transistors (or to P-FET or N-FET), as the case may be. A "conductive" transistor is able to carry a current between its main electrodes; whereas a "non-conductive" transistor is substantially not able to carry a current.

Figure 2:
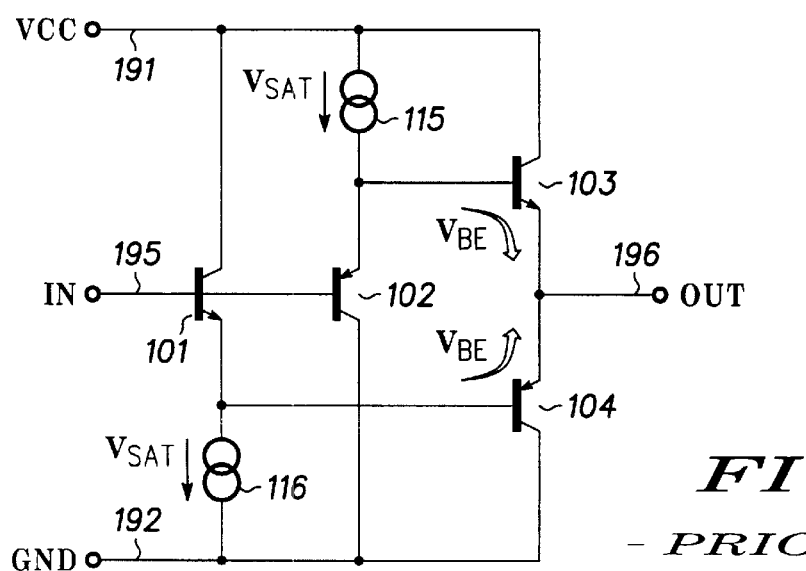
FIG. 2 illustrates a simplified circuit diagram of a driver according to the prior art which can be used in the regulator of FIG. 1.

Symbol $V_{BE}$ stands for the base-emitter voltage of a bipolar transistor (example in FIG. 2 for transistor 103). $V_{BE}$ also stands for any other similar voltage for other transistors (e.g., $V_{GS}$ gate-source voltage for FET). Symbol $V_{SAT}$ stands for the saturation voltage of a current source which is implemented, for example, also by a transistor. In equations, the reference numbers of the corresponding transistor can be added as indices. For simplicity, the acronyms for signals OUT, IN, REF_1, REF_2 are also used when the voltages of these signals are discussed. For convenience of explanation, voltages are considered—unless specified otherwise—as being positive. Symbols | | can indicate absolute values. Considering the signals as voltages is convenient for explanation, but not necessary or the present invention. For example, the signals can also be represented by currents.

Figure 1:
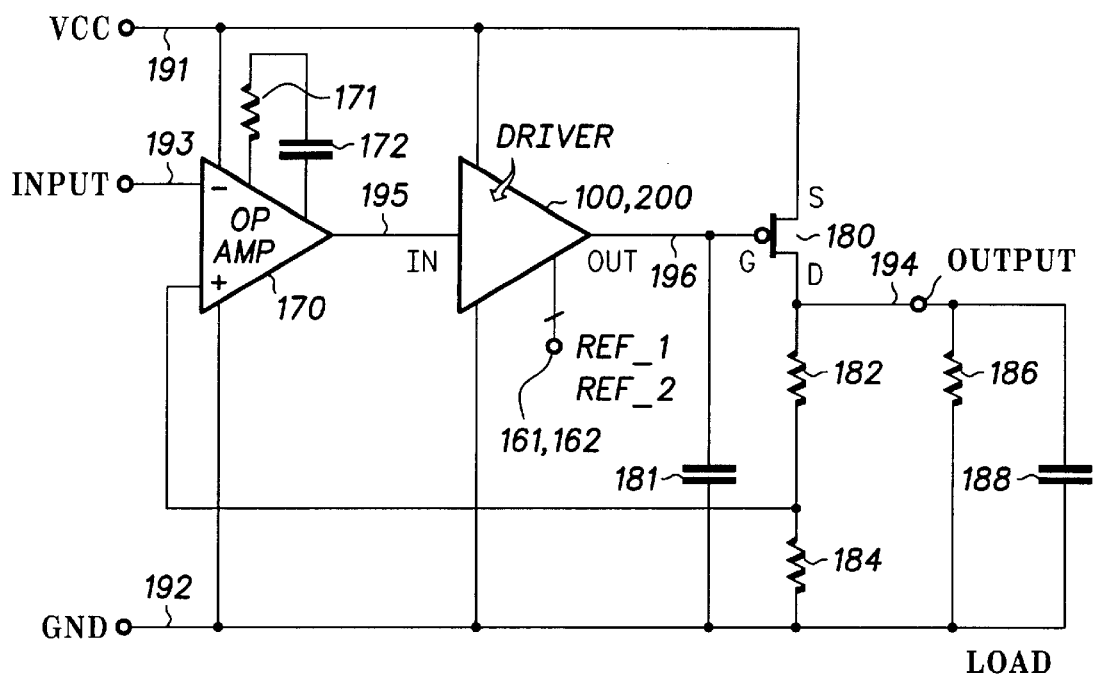
FIG. 1 illustrates a simplified block diagram of a regulator.

FIG. 1 illustrates a simplified block diagram of regulator 199. Regulator 199 comprises driver 200 according to the present invention. Regulator 199 is coupled to reference line 191 (e.g., positive voltage "VCC"), reference line 192 (e.g., ground "GND"), control input 193 (e.g., signal "INPUT") and power output 194 (e.g., signal "OUTPUT"). Further elements are power transistor 180 (e.g., a P-FET), operational amplifier ("op amp") 170 with a frequency compensation arrangement of serially coupled resistor 171 and capacitor 172, and resistors 182 and 184 as voltage divider between output 194 and line 192. A parasitic gate capacitance of transistor 180 is illustrated by capacity 181 to ground (or to a substrate). Resistor 186 in parallel to capacity 188 symbolizes an external load between output 194 and line 192. Driver 200 has input lines 161 and 162 for reference signals REF_1 and REF_2, respectively.

Regulator 199 as illustrated is known in the art as a low-drop-out (LDO) regulator. The elements are coupled, for example, as follows. Lines 191 and 192 function as supply lines for op amp 170 and for driver 200. Line 191 is coupled to the source (S) of transistor 180. The drain (D) of transistor 180 is coupled to line 192 via resistors 182 and 184. The gate (G) of transistor 180 receives signal OUT from driver 200 at drive line 196. The node between resistors 182 and 184 goes to an non-inverting input (plus symbol) of op amp 170. Op amp 170 receives INPUT in the function of a control signal at line 193 (inverting input, minus symbol). An output of op amp 170 sends signal IN to driver 200 via signal line 195.

As mentioned above, driver 200 sends signal OUT to the gate G of transistor 180 via drive line 196. As it will be explained in detail in connection with FIGS. 3–5, driver 200 comprises a booster circuit additionally to a traditional pull up/pull down arrangement. It is an advantage of the present invention that the booster circuit can pull down drive line 196 substantially to ground level GND of line 192 or to the level VCC of line 191, and that the traditional arrangement can provide any intermediate values therebetween (e.g., GND$\leq$OUT$\leq$VCC). In other words, driver 200 provides rail-to-rail switching of OUT. Further, driver 200 provides low drive impedance over the complete voltage range.

This feature of driver 200 improves the stability of regulator 199 for at least the following reasons. Regulator has an OUTPUT/INPUT transfer function with a first pole due to capacitor 172 at op amp 170, a second pole due to the external load capacity 188, a third pole due to gate capacity 181 and the output impedance of driver 200, and has only a single zero due to the RC-time constant of the frequency compensation arrangement 171/172. The zero compensates the second pole. The low impedance moves the third pole to a frequency above a transient frequency higher than the operating frequency of regulator 199.

Preferably, driver 200 is integrated with op amp 170 into a single monolithic chip (e.g., of silicon). The example of regulator 199 is intended to be a non-limiting example.

Those of skill in the art are able to connect driver 200 in a different arrangement in a different regulator or to use driver 200 in a different application which has not necessarily to be a regulator. For convenience of explanation, driver 200 is explained in comparison to prior art driver 100 (FIG. 2) which also can be used in regulator 199.

FIG. 2 illustrates a simplified circuit diagram of driver 100 according to the prior art. Driver 100 comprises transistor pair 103/104 (NPN/PNP) for traditionally pulling up or down line 196 (OUT), NPN-transistor 101, PNP-transistor 102, and current sources 115 and 116. The elements of driver 100 are coupled as follows. The collector of transistor 103 is coupled to line 191 (e.g., VCC); the emitters of transistors 103 and 104 are coupled together to drive line 196 (OUT); and the emitter of transistor 104 is coupled to line 192 (e.g., GND). Current source 115 is coupled between line 191 and the base of transistor 103 which is also coupled to the emitter of transistor 102. The collector of transistor 102 is coupled to line 192. Similarly, current source 116 is coupled between line 192 and the base of transistor 104 which is also coupled to the emitter of transistor 101. The collector of transistor 101 is coupled to line 191. Signal line 195 (IN) goes to the bases of transistors 101 and 102.

When pull-up transistor 103 is fully conductive (i.e., completely switched on), then the maximum voltage of signal OUT is limited by base-emitter voltage $V_{BE\ 103}$ and the saturation Voltage $V_{SAT\ 115}$), that is:

$$OUT_{MAX}=VCC-(|V_{BE\ 103}|+|V_{SAT\ 115}|) \quad (2)$$

When pull-down transistor 104 is fully conductive, then the minimum voltage of signal OUT is limited by base-emitter voltage $V_{BE\ 104}$ and the saturation voltage $V_{SAT\ 116}$, that is:

$$OUT_{MIN}=GND+(|V_{BE\ 104}|+|V_{SAT\ 116}|) \quad (4)$$

This limitation is a significant disadvantage of the prior art. With the trend to use low voltages VCC in modern electronics (e.g., as low as VCC at 1.5 volts or even lower), the voltage drop $|V_{BE}+V_{SAT}|$, for example, of about 0.6 volts should be avoided. There is a risk that driver 100 providing $OUT_{MIN}$ according to equation (4) does not completely switch off (i.e. make non-conductive) transistor 180 of regulator 199, for example, when the voltage drop remains higher than the threshold voltage of transistor 180.

Figure 3:
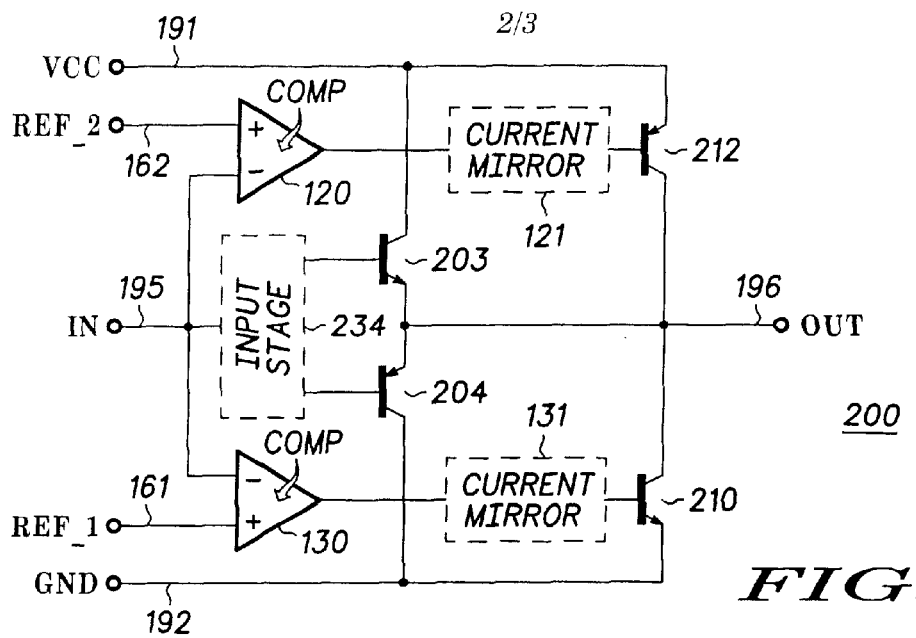
FIG. 3 illustrates a simplified block diagram of a driver according to the present invention.

FIG. 3 illustrates a simplified block diagram of driver 200 according to the present invention. Driver 200 comprises first transistor pair 203/204, second transistor pair 212/210 ("booster circuit"), and, optionally, stages 121, 131 and 234 (dashed). Transistor 203 (corresponding to transistor 103 in driver 100) has its collector-emitter path coupled between reference line 191 (VCC) and drive line 196 (OUT). Transistor 204 (corresponding to transistor 104 in driver 100) has its collector-emitter path coupled between reference line 192 (GND) and drive line 196. Transistors 203 and 204 are controlled from signal line 195 (IN) coupled to the bases of transistors 203 and 204 via stage 234 (e.g., as by transistors 101, 102 in driver 100, cf. FIG. 2). According to the present invention, transistor 212 has its emitter-collector path coupled between reference line 191 and drive line 196 and transistor 210 has its emitter-collector path coupled between reference line 192 and drive line 196. In other words, the emitter-collector paths of transistors 212 and 210 are coupled parallel to the collector-emitter paths of transistors 203 and 204, respectively. Preferably, parallel coupled transistors are of a different type, as in the example, NPN-transistor 203 parallel to PNP-transistor 212 and PNP-transistor 204 parallel to NPN-transistor 210. In other words, transistors 203 and 204 are traditionally switched as emitter followers, and "new" transistors 212 and 210 are switched as switched current sources. Transistors 212 and 210 receive control signals at their bases which depend on a magnitude relation between signal IN at signal line 195 and reference signals REF_1 and REF_2 at lines 161 and 162, respectively. Comparator 130 has a first input (e.g., non-inverting "+") at line 161 (REF_1) and a second input (e.g., inverting "−") at line 195 (IN); comparator 120 has a first input (e.g., "+") at line 162 (REF_2) and a second input (e.g., "−") at line 195 (IN). Comparator 120 drives transistor 212 via stage 121; and comparator 130 drives transistor 210 via stage 131. For example, comparators 120 and 130 are preferably implemented by differential transistor stages, and stages 121 and 131 are preferably implemented by current mirrors. Examples are illustrated later in connection with FIGS. 4–5.

In case (i), stage 234 and transistors 203 and 204 operate corresponding to driver 100 of the prior art when signal IN at line 195 assumes a magnitude within a magnitude range defined by the reference signals, that is:

$$|REF\_1|\leq|IN|\leq|REF\_2| \quad (6)$$

$OUT_{MAX}$ and $OUT_{MIN}$ at drive line 196 are limited to values given above in Eqs. (2) and (4).

In case (ii), signal IN at line 195 assumes a magnitude outside this magnitude range, that is:

(a) $|IN|\leq|REF\_1|$ or \quad (8)

(b) $|IN|\geq|REF\_2|$ \quad (10)

Case (ii) represents the rail-to-rail-switching feature and occurs when drive line 196 is switched near to line 191 or to line 192 at GND. According to the present invention, either comparator 130 with stage 131 makes transistor 210 conductive or comparator 120 with stage 121 makes transistor 212 conductive. $OUT_{MAX}$ and $OUT_{MIN}$ at drive line 196 are no longer limited and can have values of $$OUT_{MAX} = VCC - |V_{SAT212}| \quad (12)$$

$$OUT_{MAX} \approx VCC \quad (13)$$

$$OUT_{MIN} = GND + |V_{SAT210}| \quad (14)$$

$$OUT_{MIN} \approx GND \quad (15)$$

Compared to equations (2) and (4), base-emitter voltages $V_{BE}$ are excluded from calculation.

Reference signals REF_1 and REF_2 can be derived, for example, by voltage dividers between lines 191 and 192. There is no requirement to temperature stabilization or high precision. Persons of skill in the art can provide the reference signals without the need of further explanation herein.

It is a further advantage of the present invention that driver 200 does not require a feedback from line 196 to line 195.

In other words, driver 200 is a circuit for alternatively pulling drive line 196 in a first magnitude range (e.g., VCC ... GND) between first 191 and second 192 reference lines, characterized in that first transistor pair 203/204 drives drive line 196 to potentials within a second magnitude (cf. $OUT_{MAX}$ ... $OUT_{MIN}$ as in equations (2) and (4)) range smaller than the first magnitude range and second transistor pair 212/210 coupled in parallel to pair 203/204 drives drive line 196 to potentials outside the second magnitude range but within first magnitude range (cf. $OUT_{MAX}$ ... $OUT_{MIN}$ as in equations (12) and (14)). Preferably, transistor pairs 203/204 and 212/210 each comprise complementary transistors (e.g., 203:NPN/204:PNP and 212:PNP/210:NPN) and wherein the transistors which pull drive line 196 to reference line 191 and 192 are also complementary transistors (e.g., 203: NPN and 212: PNP at line 191, 204: PNP and 210: NPN at line 192).

Persons of skill in the art, are able to modify driver 200 without the need of further explanation. For example, the comparators can be implemented by digital circuitry with analog-to-digital-converters (ADCs). Also, transistors 203/204 and 212/210 can be controlled by a microprocessor.

Other advantages of the present invention become clear with the explanation of further details.

Figure 4:
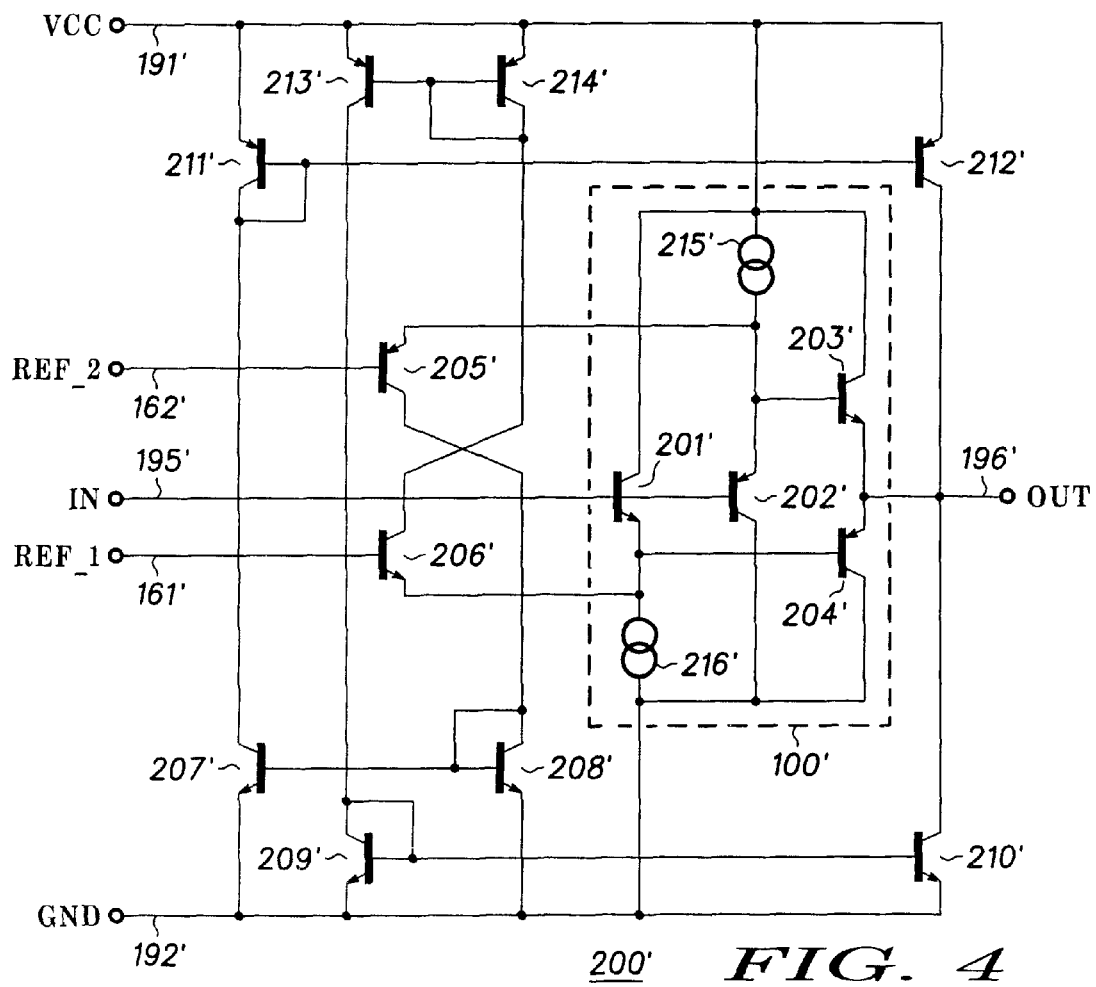
FIG. 4 illustrates a simplified circuit diagram of the driver of FIG. 3 in a first embodiment of the present invention substantially implemented with bipolar transistors.

FIG. 4 illustrates a simplified circuit diagram of driver 200' in a first embodiment of the present invention substantially implemented with bipolar transistors. In FIGS. 3–4, reference numbers 161, 162, 191, 192, 195, 196, 200, 203, 204, 210, 212 and 234 with or without prime markers are analogous. Driver 200' comprises current sources 215' (cf. 115 in FIG. 2) and 216' (cf. 116 in FIG. 2), PNP-transistors 212' (cf. FIG. 3), 204' (cf. FIGS. 2–3), 202' (cf. 102 in FIG. 2), 205', 211', 213' and 214' as well as NPN-transistors 210' (cf. FIG. 3), 203' (cf. FIGS. 2–3), 201' (cf. 101 in FIG. 2), 206', 207', 208' and 209'.

Transistors 201', 202' and current sources 215' and 216' form stage 234' (cf. FIG. 3). Stage 234' and transistors 203', 204' forming circuit 100' (dashed frame) are already known in the prior art. Transistor 205' in differential combination with transistor 202' has the function of comparator 120 (base coupled to line 162 (REF_2), emitter coupled to line 195 (IN) via transistor 202); transistor 206' in differential combination with transistor 201' has the function of comparator 130 (base coupled to line 161 (REF_1), emitter coupled to line 195 (IN) via transistor 201'); transistors 208', 207' and 211' have the function of stage 121 (current mirrors 207'/208' and 211'/212'); and transistors 213', 214' and 209' have the function of stage 131 (current mirrors 213'/214' and 209'/210').

The elements of driver 200' are coupled as follows: line 191' to the emitter of transistor 212 ("E-212"), the collector of transistor 212 ("C-212'") to line 196', C-210' also to line 196', E-210' to line 192', C-203' to line 191', E-203' and E-204' together to line 196', C-204' to line 192', source 215' between line 191' and E-202', C-202' to line 192', C-201' to line 191', source 216' between E-201' and line 192', line 195' to B-201' and B-202' (B for bases), B-203' to E-202', B-204' to E-201', E-206' to E-201', B-206' to line 161', C-206' to C-214', E-205' to E-202', B-205' to line 162', C-205' to C-208', E-213' and E-214' to line 191', B-213' and B-214' to C-214', C-213' to C-209' and B-209' and B-210', E-209' to line 192', E-208' and E-207' to line 192', B-208' and B-207' to C-208', C-207' to C-211' and B-211' and B-212', and E-211' to line 191'.

Preferably, reference signal REF_1 at line 161 is higher then a transistor base-emitter voltage, that is:

$$\text{REF\_1} > |V_{BE}| \quad (16)$$

Reference signal REF_2 at line 162 is below VCC minus the base-emitter voltage $V_{BE}$, that is:

$$\text{REF\_2} < |\text{VCC} - V_{BE}| \quad (18)$$

For case (i), driver 200' operates similar to driver 100 (FIG. 2) of the prior art. According to the present invention, driver 200' operates for case (ii) as follows. (a) Assume that the voltage of signal m is below REF_1 (see equation (8)). The current through source 216' and conductive transistor 206' is mirrored through transistors 214' and 213' and transistors 209' and 210' so that conductive transistor 210' pulls down drive line 196 almost to line 192' at GND (see equation (14)). Transistors 201' and 204' are not conductive. (b) Now assume that the voltage of signal IN is above REF_2 (see equation (10)). The current through source 215', and conductive transistor 205' is mirrored through transistors 208' and 207' and transistors 211' and 212' so that conductive transistor 212' pulls up driver line 196 almost to line 191' at VCC (see equation (12)). Transistors 202' and 203' are not conductive.

The operation of driver 200 can conveniently also be described as a method for providing a drive signal (e.g., to transistor 180) by pulling a node (e.g., drive line 196) from an initial potential (e.g., VCC) across a first potential difference (e.g., VCC to GND) to a reference line (e.g., line 192) in response to a changing input signal (e.g., IN). The examples in parenthesis refer to the pull-down operation. Prime markers are conveniently left out. The method has at least the steps of:

First, a first transistor (e.g., transistor 204) is made conductive. The first transistor has a control electrode (e.g., a base) to receive the input signal (e.g., IN via transistor 201), a first main electrode (e.g., an emitter) coupled to the node and a second main electrode (e.g., a collector) coupled to the reference line. Thereby, the first transistor pulls the node to an intermediate potential (e.g., $\text{OUT}_{MIN}$ as defined in equation (4)) with a second, smaller potential difference (e.g., $|V_{BE}| + |V_{SAT}|$) to the reference line.

Second, a second transistor (e.g., transistor 210) is made conductive. The second transistor has a control electrode (e.g., a base) to receive a control signal (from stage 131 and comparator 130) which activates the second transistor when the input signal (e.g., IN) is in a predetermined magnitude relation (e.g., smaller) to an input reference signal (e.g., |REF_1 , cf. equation (8)). The second transistor has a first main electrode (e.g., a collector) coupled to the node and a second main electrode (e.g., an emitter) coupled to the reference line. Thereby, the second transistor pulls the node to the reference line across the second potential difference from the intermediate potential (e.g., $\text{OUT}_{MIN}$ as in (4)) to the potential of the reference line (e.g., GND).

In a further, optional, step the node (e.g., line 196) is pulled back across the first potential difference (e.g., GND to VCC) from the reference line (e.g., line 192) to a further reference line (e.g., line 191) when the input signal (e.g., IN) changes in an opposite direction. Initially, a third transistor (e.g., transistor 203) is made conductive by the input signal (e.g., via transistor 202) to pull the node to a further intermediate potential (e.g., $\text{OUT}_{MAX}$ as defined in equation (2)) between the potentials of the reference line (e.g., line 192) and the further reference line (e.g., line 191). Consecutively, a fourth transistor (e.g., transistor 212) is made conductive by a further control signal (e.g., from stage 121 and comparator 120) activating the fourth transistor when the input signal (e.g., IN) crosses a further input reference signal (e.g., |REF_2|, cf. equation (10)) so that the fourth transistor pulls the node across the remaining potential difference between the further intermediate potential ($\text{OUT}_{MAX}$, equation (2)) and the potential ($\text{OUT}_{MAX}$, equations (12) and (13)) of the further reference line.

For case (i), the output impedance R of driver 200' between drive line 196' and line 192' can be estimated as:

$$R_{(i)} = \frac{k*T}{2*q*I_{BIAS(i)}} \tag{20}$$

wherein "k" is Boltzmann's constant ($1.38 \times 10^{-23}$ joules/kelvin), "T" the absolute temperature in kelvin, "q" the elementary electron charge ($1.6 \times 10^{-19}$ coulombs), and $I_{BIAS}$ the current provided by a single current source (either source 215' or 216').

For case (ii) according to the present invention, the output impedance is estimated as:

$$R_{(ii)} = \frac{k*T}{q*I_{BIAS(ii)}} \tag{22}$$

wherein $I_{BIAS}$ (ii) is the current flowing either (a) (OUT≈GND) through transistor 203' and transistor 210' (current source determining current value) or (b) (OUT≈VCC) through transistors 212' (determining current value) and transistor 204'. It is an advantage, that by scaling the current mirrors (e.g., 209'/210' and 213'/214' in the pull down branch), R(ii) can be set low. For example, in regulator 199, the third pole moves to a frequency above the transient frequency so that the stability of regulator 199 is improved.

Reference signals REF_1 and REF_2 can have different magnitudes. This is however not essential for the present invention. For REF_1≈REF_2, persons of skill in the art can simplify driver 200 by combining comparators 120 and 130 (cf. FIG. 3) to a single element.

Figure 5:
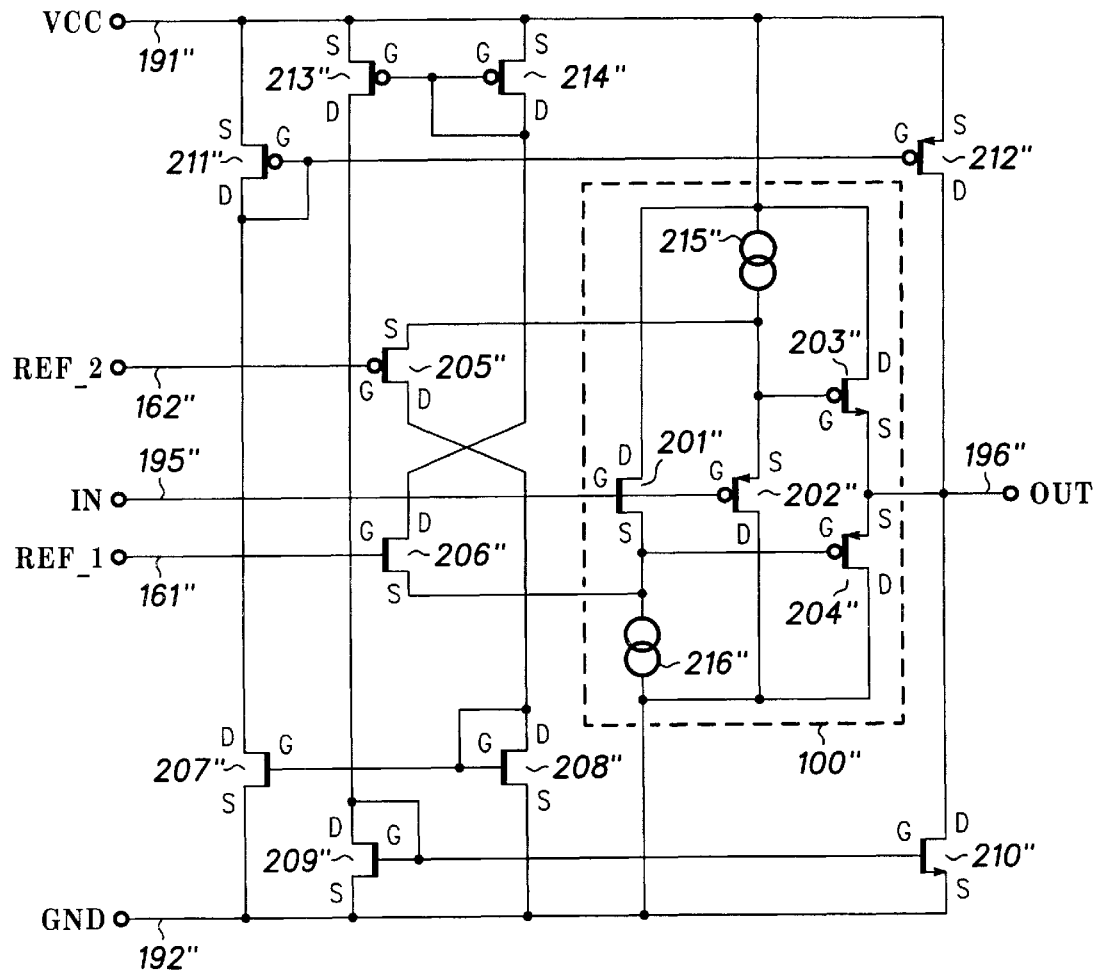
FIG. 5 illustrates a simplified circuit diagram of the driver of FIG. 3 in a second embodiment of the present invention substantially implemented with field effect transistors.

FIG. 5 illustrates a simplified circuit diagram of driver 200" in a second embodiment of the present invention substantially implemented with field effect transistors (FETs). FIG. 5 uses reference numbers with double prime markers which correspond to the numbers with single prime markers in FIG. 4; connections between the FETs and the current sources 215, 216 are also corresponding; and signals I, OUT, VCC, GND, REF_1, REF_2 are also analogous in both FIGS. P-channel FETs 212", 204", 202", 205", 211", 213"and 214" replace corresponding PNP-transistors, and N-channel FETs 210", 203", 201", 206", 207", 208" and 209" replace corresponding the NPN-transistors. The source (S) of a FET replaces the emitter (E); the drain (D) replaces the collector (C); and the gate (G) replace the base (B). The P-FETs are symbolized by a circle at the transistor gates. Which electrode is the drain D and which is the source S, depends on the applied voltages, so D and S are distinguished here only for the convenience of explanation.

As already suggested by the explanation of FIGS. 4–5, the present invention can be implemented independent from manufacturing processes. Various transistor configurations are possible, such as using only bipolar transistor (e.g., driver 200' of FIG. 4), only FETs (e.g., driver 200" of FIG. 5), or a combination of bipolar transistors and FETs.

The present invention was conveniently described by driver 200 which has a "pull up" branch (e.g., transistors 203, 212, comparator 120) and which has a "pull down" branch (e.g., transistors 204, 210, comparator 130). However, the present invention is also applicable in a driver with a single branch and can be described by an apparatus (e.g., regulator 199) having a driver (e.g., driver 200) receiving an input signal IN and providing an output signal OUT at an output node (e.g., driver line 196). The output node has variable potential OUT between reference potential VCC and reference potential GND.

Using the reference numbers and acronyms for the "pull up" branch, the driver comprises a first transistor (e.g., 203) to pull output node 196 so that variable potential OUT is in a first magnitude relation (smaller than) to intermediate potential $OUT_{MAX}$ (cf. equation (2)) between VCC and GND; the first transistor being conductive when input signal IN is substantially in a first magnitude relation (e.g., smaller than |REF_2|) to first input reference signal |REF_2|; and a second transistor (e.g., 212) having main electrodes parallel to the first transistor also pulls output node 196 so that variable potential OUT is in a second magnitude relation (larger than) to first intermediate potential $OUT_{MAX}$; the second transistor being conductive when input signal IN is in a second, opposite relation (e.g., larger than |REF_2|) to first input reference signal |REF_2|.

Using the reference numbers and acronyms for the "pull down" branch, the driver comprises a first transistor (e.g., 204) to pull output node 196 so that variable potential out is in a first magnitude relation (larger than) to intermediate signal $OUT_{MIN}$ (cf. equation (4)) between vcc and gnd; the first transistor being conductive when input signal in is substantially in a first magnitude relation (e.g., larger than |REF_1|) to first input reference signal |REF_1|; an a second transistor (e.g., 210) having main electrodes parallel coupled to the first transistor also pulls output node 196 so that variable potential out is in a second magnitude relation (smaller than) to first intermediate potential $OUT_{MIN}$; the second transistor being conductive when input signal in is in a second, opposite relation (e.g., smaller than |REF_1|) to first input reference signal |REF_1|.

While the invention has been described in terms of particular structures, devices and methods, those of skill in the art will understand based on the description herein that it is not limited merely to such examples and that the full scope of the invention is properly determined by the claims that follow.

What is claimed is:

1. A driver circuit, comprising:
    an input stage coupled for receiving an input signal and coupled to provide first and second drive signals, wherein the input stage comprises:
        a first input transistor having a control input coupled to receive the input signal, a first conductor coupled to a second power supply conductor and a second conductor coupled to provide the first drive signal; and
        a first current mirror circuit having an input coupled to receive a first reference signal and having an output coupled to provide the second drive signal when the input signal is above the first reference signal; and
    an output stage coupled between first and second power supply conductors and having an output node, the output stage including,
        (a) a first transistor having a first conduction terminal coupled directly to the first power supply conductor, a second conduction terminal coupled directly to the output node, and a control terminal coupled to receive the first drive signal; and
        (b) a second transistor having a first conduction terminal coupled directly to the first power supply conductor, a second conduction terminal coupled directly to the output node, and a control terminal coupled to receive the second drive signal.

2. The driver circuit of claim 1, wherein the first current mirror comprises:
    a first transistor having a control terminal coupled to receive the first reference signal, a first conductor coupled to receive the first drive signal and a second conductor coupled to a first node;

a second transistor having a control terminal coupled to a first conductor of the second transistor at the first node;

a third transistor having a control terminal coupled to the first node and a first conductor coupled to a second node; and a fourth transistor having a control terminal coupled to a first conductor of the fourth transistor at the second node to provide the second drive signal.

3. The driver circuit of claim 1, wherein the input stage further comprises:

a second input transistor having a control input coupled to receive the input signal, a first conductor coupled to the first power supply conductor and a second conductor coupled to provide a third drive signal; and a second current mirror circuit having an input coupled to receive a second reference signal and having an output coupled to provide a fourth drive signal when the input signal is below the second reference signal.

4. The driver circuit of claim 3, wherein the second current mirror comprises:

a first transistor having a control terminal coupled to receive the second reference signal, a first conductor coupled to receive the third drive signal and a second conductor coupled to a third node;

a second transistor having a control terminal coupled to a first conductor of the second transistor at the third node;

a third transistor having a control terminal coupled to the third node and a first conductor coupled to a fourth node; and a fourth transistor having a control terminal coupled to a first conductor of the fourth transistor at the fourth node to provide the fourth drive signal.

5. The driver circuit of claim 3 wherein the output stage further includes:

a third transistor having a first conduction terminal coupled to the second power supply conductor, a second conduction terminal coupled to the output node, and a control terminal coupled to receive the third drive signal; and a fourth transistor having a first conduction terminal coupled to the second power supply conductor, a second conduction terminal coupled to the output node, and a control terminal coupled to receive the fourth drive signal.

6. A method of controlling an output stage of a driver circuit to provide first and second magnitude ranges of an output signal, comprising:

activating a first transistor of a first pair of transistors of opposite conductivity types connected in parallel during the first magnitude range of the output signal, wherein activating the first transistor includes
receiving an input signal; and
controlling a conductivity state of the first transistor with the input signal; and activating a second transistor of the first pair of transistors of opposite conductivity types connected in parallel during the second magnitude range of the output signal, wherein activating the second transistor deactivates the first transistor, and activating the second transistor comprises:
comparing the input signal to a first reference level; and
activating a first current mirror after the input signal falls below the first reference level.

7. A method of controlling an output stage of a driver circuit to provide first and second magnitude ranges of an output signal, comprising:

activating a first transistor of a first pair of transistors of opposite conductivity types connected in parallel during the First magnitude range of the output signal; and activating a second transistor of the first pair of transistors of opposite conductivity types connected in parallel during the second magnitude range of the output signal, wherein activating the second transistor deactivates the first transistor, and activating the second transistor comprises
comparing the input signal to a second reference level; and
activating a current mirror after the input signal falls below the second reference level; and activating a first transistor of a second pair of transistors of opposite conductivity types during the first magnitude range of the output signal; and activating a second transistor of the second pair of transistors of opposite conductivity types during the second magnitude range of the output signal.

* * * * *